United States Patent
Bryan et al.

(10) Patent No.: US 6,552,582 B1
(45) Date of Patent: Apr. 22, 2003

(54) SOURCE FOLLOWER FOR LOW VOLTAGE DIFFERENTIAL SIGNALING

(75) Inventors: Thomas Clark Bryan, Rancho Santa Fe, CA (US); Harry Huy Dang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/966,388

(22) Filed: Sep. 27, 2001

(51) Int. Cl.[7] .............................................. H03B 1/00
(52) U.S. Cl. ........................................ 327/108; 327/84
(58) Field of Search ............................ 327/108, 84, 92, 327/423, 587, 588; 326/83, 84, 85, 87; 330/253

(56) References Cited

U.S. PATENT DOCUMENTS

| | | | |
|---|---|---|---|
| 5,177,379 A | 1/1993 | Matsumoto | 326/26 |
| 5,414,382 A | 5/1995 | Larson et al. | 327/561 |
| 5,424,662 A | 6/1995 | Bonaccio | 327/108 |
| 5,811,997 A | 9/1998 | Chengson et al. | 327/112 |
| 5,959,472 A * | 9/1999 | Nagamatsu et al. | 326/27 |
| 6,118,438 A * | 9/2000 | Ho | 345/100 |
| 6,208,161 B1 | 3/2001 | Suda | 326/30 |
| 6,307,402 B1 * | 10/2001 | Hedberg | 326/115 |
| 6,316,964 B1 * | 11/2001 | Watarai | 326/115 |

* cited by examiner

*Primary Examiner*—Timothy P. Callahan
*Assistant Examiner*—Linh Nguyen
(74) *Attorney, Agent, or Firm*—Gray Cary Ware & Freidenrich; Terrance A. Meador

(57) ABSTRACT

A source follower circuit for low voltage differential signaling (LVDS) has a low power consumption, low noise, and the ability to drive a highly capacitive load at an output port of an integrated circuit (IC). The source follower circuit includes a first p-channel transistor having a drain coupled to a supply voltage and a gate coupled to a first input; a second p-channel transistor having a drain coupled to the supply voltage and a gate coupled to a second input which is complementary to the first input; a third p-channel transistor having a gate coupled to the second input, a source coupled to ground, and a drain coupled to a source of the first p-channel transistor which forms a first output; and a fourth p-channel transistor having a source coupled to the ground and a drain coupled to a source of the second p-channel transistor which forms a second output which is complementary to the first output. Advantageously, the output signals of the circuit are referenced to ground and are less affected by power supply variations.

11 Claims, 3 Drawing Sheets

US 6,552,582 B1

SOURCE FOLLOWER FOR LOW VOLTAGE DIFFERENTIAL SIGNALING

BACKGROUND OF THE INVENTION

1. Field of the Invention

The present invention relates generally to source follower circuits, and more particularly to integrated circuits (ICs) having source followers which comply with Low Voltage Differential Signaling (LVDS) standards.

2. Description of the Related Art

Physical layer interfaces are often a critical bottleneck in any application that requires high bandwidths, such as telecommunications and high-speed networking. Achieving high data transmission in a wireless base station, for example, is critical in.order to increase the variety of services offered with wireless telephones—services such as e-mail, the Internet, and high-quality audio and video communications.

With its high speeds, low power, and low cost profile, Low Voltage Differential Signaling (LVDS) is one of the most promising technologies to address the physical layer interface. LVDS is a relatively new data interface standard that is defined in the Telecommunications Industry Association/Electronics Industry Association (TIA/EIA)-644 and the Institute of Electrical and Electronics Engineers (IEEE) 1596.3 standards. Essentially, it is a signaling method used for high-speed transmission of binary data over wirelines. The standard specifies a lower voltage swing than other transmission standards in order to provide higher data transmission speeds and inherently a greater bandwidth at a lower power consumption.

During operation, an LVDS driver converts a standard transistor-transistor logic/complementary metal-oxide semiconductor (TTL/CMOS) signal into a low-voltage differential signal. This differential signal is specified to travel at rates up to 655 megabits per second (Mbps) over media such as copper cables or printed circuit board (PCB) traces. An LVDS receiver receives and then translates this differential signal back into the TTL/CMOS signal. Since LVDS receivers respond only to differential voltages, they are relatively immune to noise such as common-mode signal reflections and electromagnetic interference (EMI) emissions are also reduced. LVDS also offers designers flexibility with the power supply voltage, as the technology is compatible at 5 volts, 3.3 volts, and lower. As a result, designers can reuse their LVDS solution even as systems move to lower voltages.

General purpose LVDS technology addresses point-to-point physical layer interfaces. These include intrasystem connections via printed circuit board traces or cables. The ultimate rate and distance of LVDS data transfer is dependent on the attenuation characteristics of the media and the noise coupling to the environment. Applications for general-purpose LVDS technologies include central office, PBXs, switches, repeaters, and base stations—all in the telecommunications field. Such technologies are also used in hubs and routers in data communications, and other applications such as digital cameras, printers and copiers.

Outside the TIA/EIA-644 standard lies multipoint LVDS. Multipoint LVDS supports backplane applications, such as proprietary buses and small computer system interface (SCSI). SCSI is a high-performance peripheral interface that distributes data independently of the host computer and is commonly used with devices such as hard disk drives, tape drives, CD-ROMs, and scanners. In addition to general-purpose point-to-point and multipoint applications, LVDS has been used for several years as an interface to flat panel displays in notebook computers.

Although there are several advantages in adhering to the LVDS standard, the actual design of circuitry for low power and low noise is challenging. Conventional source follower circuits, for example, utilize both p-channel and n-channel transistor devices and provide a common mode voltage that is referenced to a positive supply voltage $V_{DD}$. A resistor is typically used to set the output impedance. As a result of such conventional designs, large voltage swings on the chip exist which create high current spikes and thus high noise and power consumption. What is needed is a source follower circuit for LVDS which has a low power consumption, low noise, and the ability to drive a variety of different output loads. The source follower circuit should also have the ability to operate over variations in the power supply voltage.

SUMMARY OF THE INVENTION

According to the present invention, a source follower circuit for low voltage differential signaling (LVDS) has a low power consumption, low noise, and the ability to drive a highly capacitive load at an output port of an integrated circuit (IC). Advantageously, output signals of the circuitry are referenced to ground and are less affected by power supply variations. The source follower circuit includes a first p-channel transistor having a drain coupled to a first supply voltage and a gate coupled to a first input; a second p-channel transistor having a drain coupled to the first supply voltage and a gate coupled to a second input which is complementary to the first input; a third p-channel transistor having a gate coupled to the second input, a source coupled to a second supply voltage that is less than the first supply voltage, and a drain coupled to a source of the first p-channel transistor which forms a first output; and a fourth p-channel transistor having a source coupled to the second supply voltage and a drain coupled to a source of the second p-channel transistor which forms a second output which is complementary to the first output.

DETAILED DESCRIPTION OF THE PREFERRED EMBODIMENTS

An inventive source follower circuit for low voltage differential signaling (LVDS) has a low power consumption, low noise, and the ability to drive a highly capacitive load at an output port of an integrated circuit (IC). The source follower circuit includes a first p-channel transistor having a drain coupled to a first supply voltage and a gate coupled to a first input; a second p-channel transistor having a drain coupled to the first supply voltage and a gate coupled to a second input which is complementary to the first input; a third p-channel transistor having a gate coupled to the second input, a source coupled to a second supply voltage that is less than the first supply voltage, and a drain coupled to a source of the first p-channel transistor which forms a first output; and a fourth p-channel transistor having a source coupled to the second supply voltage and a drain coupled to a source of the second p-channel transistor which forms a second output which is complementary to the first output.

Figure 1:
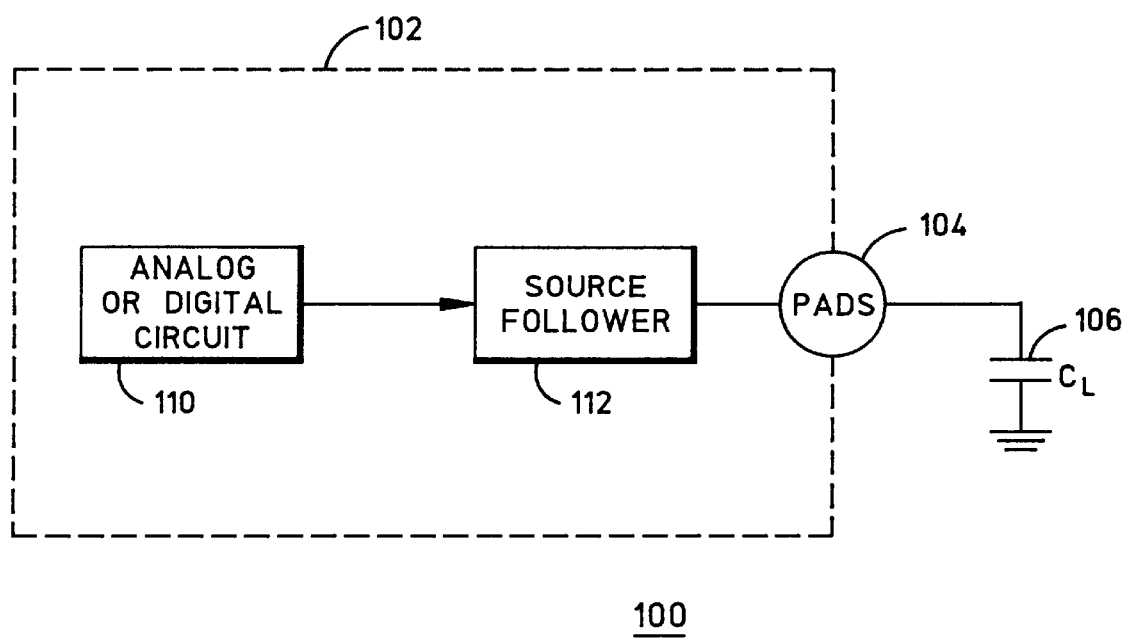
FIG. 1 is a schematic block diagram of an electronic device which includes a source follower circuit of the present invention.

FIG. 1 is a schematic block diagram of an electronic device 100 which includes a source follower circuit 112 of the present invention. Electronic device 100 may be any suitable electronic device, such as a base station, a digital camera, a router, etc. including those devices described in the Background of the Invention and others. Electronic device 100 has an integrated circuit (IC) 102 which embodies an analog or digital circuit 110 and a source follower circuit 112. Analog or digital circuit 110 is one that obtains or produces digital data signals ('1's or '0's) and feeds them source follower circuit 112 using complementary output signals. Source follower circuit 112 has a (complementary) output coupled to output pads 104 of IC 102. Output pads 104 are coupled to a load external to IC 102 and represented by a capacitor 106 having a capacitance $C_L$. High speed data signals (e.g., data signals at speeds ranging from 150 MHz to 1.2 GHz) are communicated from source follower circuit 112 to the load.

Figure 2:
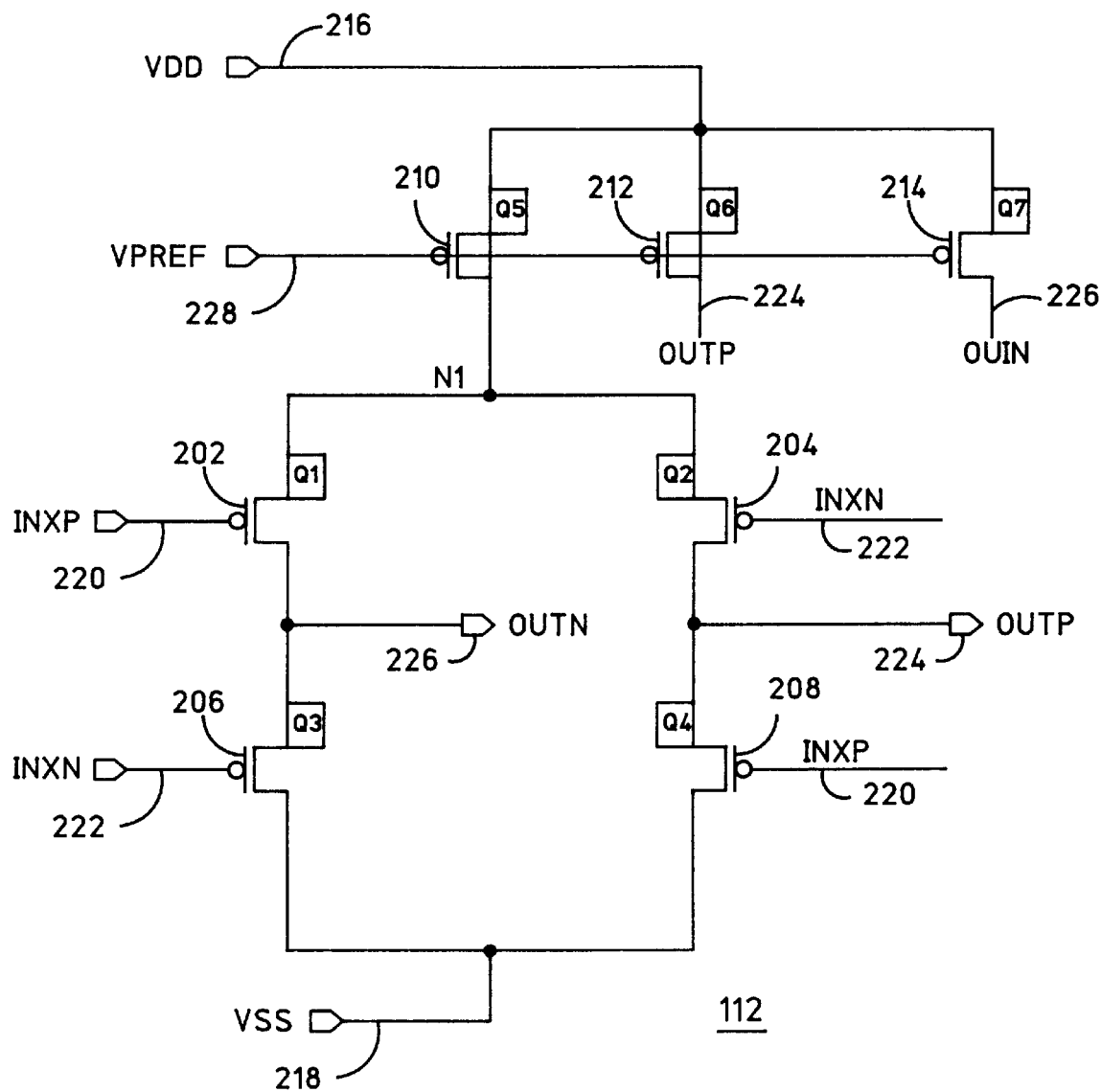
FIG. 2 is a schematic diagram of the source follower circuit of FIG. 1.

FIG. 2 is a schematic diagram of source follower circuit 112 of FIG. 1. Source follower circuit is designed to operate in accordance with low voltage differential signaling (LVDS). As described in the Background of the Invention, LVDS is a data interface standard that is defined in the Telecommunications Industry Association/Electronics Industry Association (TIA/EIA)-644 and the Institute of Electrical and Electronics Engineers (IEEE) 1596.3 standards. Source follower circuit 112 has a low power consumption, low noise, and the ability to drive a highly capacitive load at output pads 104 of IC 102 (FIG. 1).

Source follower circuit 112 includes at least four p-channel transistors 202, 204, 206, and 208. P-channel transistor 202 (Q1) has a drain coupled to a first supply voltage 216 ($V_{DD}$) and a gate coupled to a first input 220 (INXP). P-channel transistor 204 (Q2) has a drain coupled to first supply voltage 216 and a gate coupled to a second input 222 (INXN) which is complementary to first input 220. P-channel transistor 206 (Q3) has a gate coupled to second input 222, a source coupled to a second supply voltage 218 ($V_{SS}$) that is less than first supply voltage 216, and a drain coupled to a source of p-channel transistor 202 which forms a first output 226 (OUTN). P-channel transistor 208 (Q4) has a source coupled to second supply voltage 218 and a drain coupled to a source of p-channel transistor 204 which forms a second output 224 (OUTP) which is complementary to first output 226.

Source follower circuit 112 of FIG. 2 also includes p-channel transistors 210, 212, and 214. P-channel transistor 210 (Q5) has a source coupled to the drains of p-channel transistors 202 and 204, a drain coupled to first supply voltage 216, and a gate coupled to a biasing voltage 228 ($V_{PREF}$). P-channel transistor 210 is a current biasing circuit for p-channel transistors 202, 204, 206, and 208. P-channel transistor 212 (Q6) has a source coupled to second output 224, a drain coupled to first supply voltage 216, and a gate coupled to biasing voltage 228. Similarly, p-channel transistor 226 (Q7) has a source coupled to first output 226, a drain coupled to first supply voltage 216, and a gate coupled to biasing voltage 228. P-channel transistors 212 and 214 are pull-up transistors for first and second outputs 224 and 226, respectively. That is, p-channel transistors 212 and 214 provide small pull-up currents for output signals at first and second outputs 224 and 226 in order to reduce the output impedance when they are low (i.e., when Q1 or Q2 is off). With use of p-channel transistors 224 and 226, the output impedance of source follower circuit 112 can be set very low.

In a preferred embodiment, first supply voltage 216 is between about 1.8 and 5.0 volts; second supply voltage 218 is ground at 0 volts; biasing voltage 228 is about 700 millivolts; the data input signals at first and second inputs 220 and 220 vary between ground (for bit '0') and 500 millivolts (for bit '1'); the common mode point is between about 1.00–1.35 volts; and the output swing is between about 250–500 millivolts. With use of p-channel transistors 224 and 226, the output impedance of source follower circuit 112 can be set to be between about 40–140 ohms.

FIG. 3A is a first signal timing diagram showing a first data input signal 302 to source follower circuit 112 of FIG. 2, and FIG. 3B is a second signal timing diagram showing a second data input signal 304 to source follower circuit 112 of FIG. 2. As illustrated, second data input signal 304 is complementary to the first data input signal 302 of FIG. 3A. Although for explanation the first and second data input signals 302 and 304 are shown as changing digital states from '0' to '1' repeatedly, these states actually vary somewhat randomly as data normally would. As described earlier, the digital data signals may be communicated at high speeds, for example, at speeds ranging from 150 MHz to 1.2 GHz.

FIGS. 3C through 3F show on-off timing diagrams of p-channel transistors 202, 204, 206, and 208, respectively, responsive to first and second data input signals 302 and 304 of FIGS. 3A–3B. More particularly, FIG. 3C shows on-off states 306 of p-channel transistor 202; FIG. 3D shows on-off states 308 of p-channel transistor 204; FIG. 3E shows on-off states 310 of p-channel transistor 206; and FIG. 3F shows on-off states 312 of p-channel transistor 208.

FIG. 3G is a third signal timing diagram showing a first data output signal 314 at second output 224 of FIG. 2, and FIG. 3H is a fourth signal timing diagram showing a second data output signal 316 at first output 226 of FIG. 2. The second data output signal 316 of FIG. 3H is complementary to the first data output signal 314 of FIG. 3G.

Figure 3:
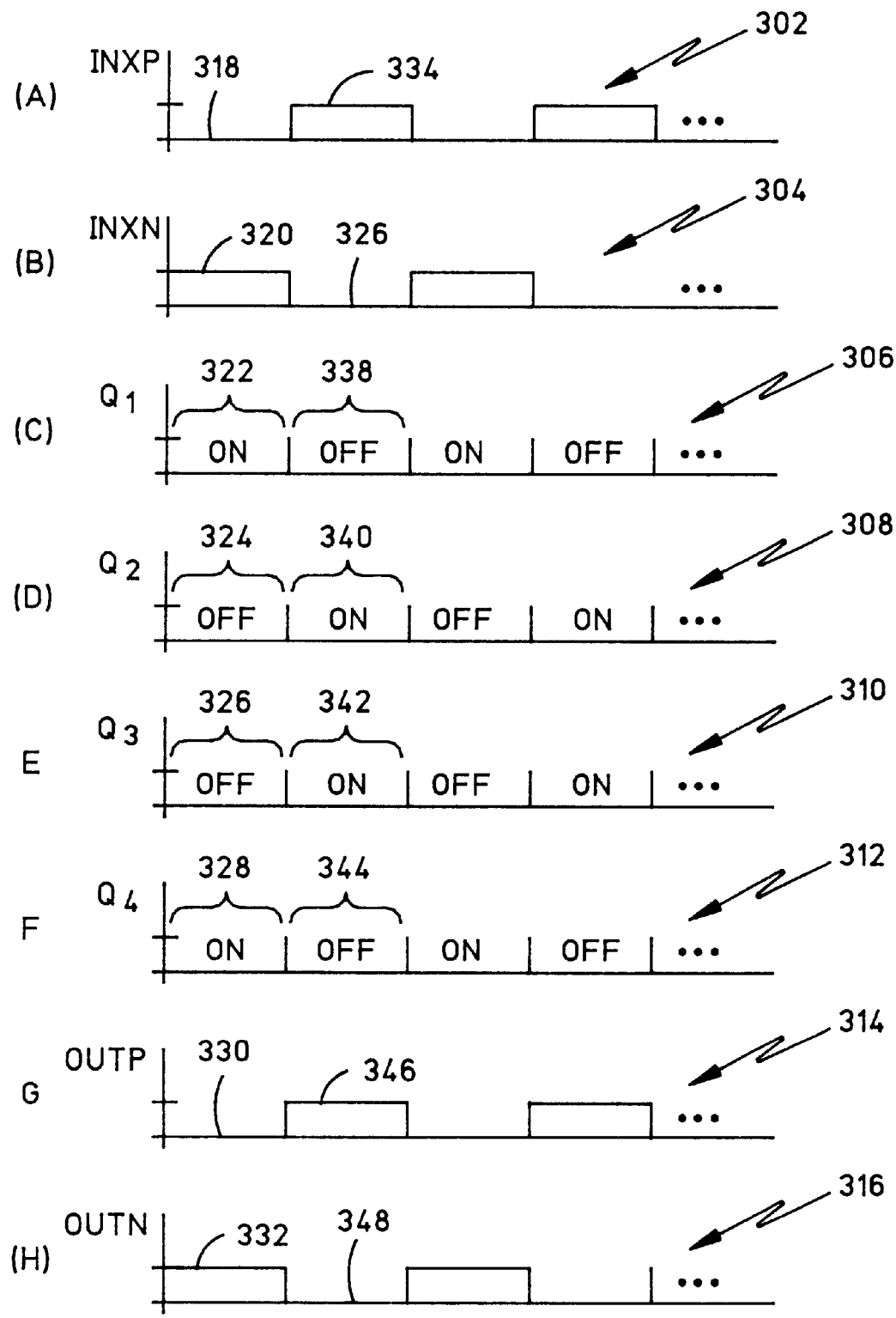
FIG. 3A is a first signal timing diagram showing a first data input signal to the source follower circuit of FIG. 2.
FIG. 3B is a second signal timing diagram showing a second data input signal to the source follower circuit, wherein the second data input signal is complementary to the first data input signal of FIG. 3A.
FIG. 3C is a first on-off timing diagram of a first transistor of the source follower circuit.
FIG. 3D is a second on-off timing diagram of a second transistor of the source follower circuit.
FIG. 3E is a third on-off timing diagram of a third transistor of the source follower circuit.
FIG. 3F is a fourth on-off timing diagram of a fourth transistor of the source follower circuit.
FIG. 3G is a third signal timing diagram showing a first data output signal from the source follower circuit.
FIG. 3H is a fourth signal timing diagram showing a second data output signal from the source follower circuit, wherein the second data output signal is complementary to the first data output signal of FIG. 3G.

Reference will now be made to FIGS. 2 and 3 in combination. When first data input signal 302 of FIG. 3A is low ('0') (see a LOW signal portion 318 in FIG. 3A), second data input signal 304 of FIG. 3B is high ('1') (see a HIGH signal portion 320 in FIG. 3B). As a result, p-channel transistor 202 is on (see an ON state 322 in FIG. 3C); p-channel transistor 204 is off (see an OFF state 324 in FIG. 3D); p-channel transistor 206 is off (see an OFF state 326 in FIG. 3E); and p-channel transistor 208 is on (see an ON state 328 in FIG. 3F). Here, first data output signal 314 is low (see a LOW signal portion 330 in FIG. 3G) and its voltage level is the difference in potential between the drain and the source of p-channel transistor 208. Conversely, second data output signal 316 is high (see a HIGH signal portion 332 in FIG. 3G) and its voltage level is the difference in potential between the drain and the source of p-channel transistor 206.

When first data input signal 302 of FIG. 3A is high ('1') (see a HIGH signal portion 334 in FIG. 3A), second data input signal 304 of FIG. 3B is low ('0') (see a LOW signal portion 336 in FIG. 3B). As a result, p-channel transistor 202 is off (see an OFF state 338 in FIG. 3C); p-channel transistor 204 is on (see an ON state 340 in FIG. 3D); p-channel transistor 206 is on (see an ON state 342 in FIG. 3E); and p-channel transistor 208 is off (see an OFF state 344 in FIG. 3F). Here, first data output signal 314 is high (see a HIGH signal portion 346 in FIG. 3G) and its voltage level is the difference in potential between the drain and the source of p-channel transistor 208. Conversely, second data output signal 316 is low (see a LOW signal portion 348 in FIG. 3G) and its voltage level is the difference in potential between the drain and the source of p-channel transistor 206. As shown in FIGS. 3A–3H, the on-off states and output signals may be fashioned continually responsive to the input data signals.

As described herein, an integrated circuit has a source follower circuit which includes a first transistor having a drain coupled to a first supply voltage and a gate coupled to a first input; a second transistor having a drain coupled to the first supply voltage and a gate coupled to a second input which is complementary to the first input; a third transistor having a gate coupled to the second input, a source coupled to a second supply voltage which is less than the first supply voltage, and a drain coupled to a source of the first transistor and forming a first output; and a fourth transistor having a source coupled to the second supply voltage, a drain coupled to a source of the second transistor and forming a second output which is complementary to the first output.

The first through fourth transistors may be p-channel transistors. Preferably, the first supply voltage is within the range of 1 to 5 volts and the second supply voltage is ground; the first and the second inputs may be digital data inputs. A current biasing circuit is coupled between the first and the second transistors and the first supply voltage. A first pull-up transistor may be coupled between the first output and the first supply voltage, and a second pull-up transistor may be coupled between the second output and the first supply voltage.

Advantageously, the output signals of the circuitry are referenced to ground and are therefore less affected by power supply variations. The circuitry consumes little power, has low noise, and has the ability to drive a highly capacitive load at an output port of an IC. Pull-up transistors are utilized in lieu of a resistor in order to set the output impedance, which advantageously can be set very low.

It is to be understood that the above is merely a description of preferred embodiments of the invention and that various changes, alterations, and variations may be made without departing from the true spirit and scope of the invention as set for in the appended claims. None of the terms or phrases in the specification and claims has been given any special particular meaning different from the plain language meaning to those skilled in the art, and therefore the specification is not to be used to define terms in an unduly narrow sense.

What is claimed is:

1. An integrated circuit (IC) having a source follower comprising:
    a first transistor having a drain coupled to a first supply voltage and a gate coupled to a first input;
    a second transistor having a drain coupled to the first supply voltage and a gate coupled to a second input which is complementary to the first input;
    a third transistor having a gate coupled to the second input, a source coupled to a second supply voltage which is less than the first supply voltage, and a drain coupled to a source of the first transistor and forming a first output;
    a fourth transistor having a source coupled to the second supply voltage, a drain coupled to a source of the second transistor and forming a second output which is complementary to the first output;
    a first pull-up transistor coupled between the first output and the first supply voltage; and a second pull-up transistor coupled between the second output and the first supply voltage.

2. An electronic device, comprising:
    a load having first and second inputs;
    an integrated circuit (IC) which embodies a source follower circuit including:
        a first transistor having a drain coupled to a supply voltage and a gate coupled to a first input;
        a second transistor having a drain coupled to the supply voltage and a gate coupled to a second input which is complementary to the first input;
        a third transistor having a gate coupled to the second input, a source coupled to a ground, and a drain coupled to a source of the first transistor and forming a first output;
        a fourth transistor having a source coupled to the ground, a drain coupled to a source of the second transistor and forming a second output which is complementary to the first output;
        a current biasing circuit coupled between the first and the second transistors and the supply voltage;
        first and second output pads of the IC coupled to the first and second inputs of the load;
        a first pull-up transistor coupled between the first output and the supply voltage; and a second pull-up transistor coupled between the second output and the supply voltage.

3. The IC of claim 1, wherein the source follower is embodied in the IC and the first and the second outputs are coupled to first and second output pins, respectively, of the IC.

4. The IC of claim 1, wherein the source follower has the first supply voltage within the range of 1 to 5 volts and the second supply voltage as ground.

5. The IC of claim 1, wherein the first and the second source follower inputs comprise digital data inputs.

6. The IC of claim 1, wherein the first through the fourth transistors comprise p-channel transistors.

7. The IC of claim 1, wherein the source follower is configured in accordance with a low voltage differential signaling (LVDS) specification.

8. The IC of claim 1, the source follower further comprising:
    a current biasing circuit coupled between the first and the second transistors and the first supply voltage.

9. The electronic device of claim 2, wherein the first through the fourth transistors of the source follower circuit comprise p-channel transistors.

10. The electronic device of claim 2, wherein the current biasing circuit comprises a fifth transistor having a source coupled to the drains of the first and the second transistors, a drain coupled to the supply voltage, and a gate coupled to a biasing voltage.

11. The electronic device of claim 2, further comprising:
    a fifth transistor having a source coupled to the second output, a drain coupled to the supply voltage, and a gate coupled to a biasing voltage; and
    a sixth transistor having a source coupled to the first output, a drain coupled to the supply voltage, and a gate coupled to the biasing voltage.

* * * * *